United States Patent [19]

Beasom

[11] Patent Number: 5,091,336
[45] Date of Patent: Feb. 25, 1992

[54] METHOD OF MAKING A HIGH BREAKDOWN ACTIVE DEVICE STRUCTURE WITH LOW SERIES RESISTANCE

[75] Inventor: James D. Beasom, Melbourne Village, Fla.

[73] Assignee: Harris Corporation, Melbourne, Fla.

[21] Appl. No.: 592,308

[22] Filed: Oct. 3, 1990

Related U.S. Application Data

[60] Division of Ser. No. 253,437, Oct. 19, 1988, Pat. No. 4,975,751, which is a continuation of Ser. No. 774,282, Sep. 9, 1985, abandoned.

[51] Int. Cl.$^5$ .................................................. H01L 21/22
[52] U.S. Cl. ................................. 437/150; 437/156; 437/917; 148/DIG. 85; 148/DIG. 126; 148/DIG. 167
[58] Field of Search ............... 437/147, 148, 149, 150, 437/151, 152, 153, 154, 917, 156, 157; 148/DIG. 38, DIG. 34, DIG.167, DIG. 85, DIG. 126

[56] References Cited

U.S. PATENT DOCUMENTS

| | | | |
|---|---|---|---|
| 3,183,128 | 5/1965 | Leistiko, Jr. et al. | 357/90 |
| 3,252,062 | 5/1966 | Kooi | 357/13 |
| 3,450,961 | 6/1969 | Tsai | 357/43 |
| 3,488,527 | 1/1970 | Ruegg | 357/13 |
| 3,772,079 | 3/1973 | Beasom | 148/DIG. 85 |
| 3,821,657 | 6/1974 | Yo et al. | 357/34 |
| 3,865,649 | 2/1975 | Beasom | 148/DIG. 85 |
| 3,883,372 | 5/1975 | Lin | 437/150 |
| 3,909,320 | 9/1975 | Gauge et al. | 357/23.4 |
| 3,911,461 | 10/1975 | Clark | 357/34 |
| 4,144,098 | 3/1979 | Roesner | 437/156 |
| 4,242,697 | 12/1980 | Berthold et al. | 357/38 |
| 4,258,379 | 3/1981 | Watanabe et al. | 357/92 |
| 4,290,831 | 9/1981 | Ports et al. | 148/DIG. 85 |
| 4,366,495 | 12/1982 | Goodman et al. | 357/23.4 |

OTHER PUBLICATIONS

"Introduction to Electronic Systems, Circuits, and Devices" by D. O. Peterson, J. T. Studer & J. R. Whinnery; McGraw-Hill Book Company, 1966.

"Solid State Electronic Devices" by Ben G. Streetman; Prentice-Hall, Inc., 1972.

Primary Examiner—Brian E. Hearn
Assistant Examiner—C. Chaudhari
Attorney, Agent, or Firm—Barnes & Thornburg

[57] ABSTRACT

Series resistance in the low impurity portion of a high breakdown PN junction of a three or four layer device is reduced by providing an increased inpurity region at the junction of the same conductivity type as the low impurity portion and having an impurity profile such that the increased impurity region is depleted under reverse biasing before critical field is reached therein. The three layer devices include insulated gate field effect transistors and bipolar devices and the four layer device is a semiconductor controlled rectifier (SCR).

16 Claims, 2 Drawing Sheets

METHOD OF MAKING A HIGH BREAKDOWN ACTIVE DEVICE STRUCTURE WITH LOW SERIES RESISTANCE

This is a divisional of application Ser. No. 07/253,437, now U.S. Pat. No. 4,975,751, filed Oct. 5, 1988, which is a continuation of Ser. No. 06/774,282, filed Sept. 9, 1985, now abandoned.

BACKGROUND AND SUMMARY OF THE INVENTION

The present invention relates generally to high voltage components and more specifically to high voltage components with low series resistance.

A problem with several high voltage component devices such as a doubly diffused MOS device (DMOS) is the large series resistance associated with the lightly doped region, for example the drain. Since the drain must support the high voltage, its doping is very light. This increases the resistance of the drain specifically from the channel to the drain contact. One method of the prior art which uses large area components to reduce the series resistance to acceptable values.

Although DMOS's is used as an example, other three layer devices which include two PN junctions also are generally formed in lightly doped background material and, thus, the series resistance of the lightly doped region is increased in order to support the high voltage. This applies to bipolar devices, MOS devices and four layer (SCR) devices.

Thus, it is an object of the present invention to provide a method which allows smaller area components to achieve a given resistance at a given breakdown voltage.

Another object of the present invention is to provide such components which both reduce the cost of the components and improve their performance.

Yet another object of the present invention is to produce such components with reduced current leakage and capacitance which are proportional to component area.

These and other objects of the invention are attained by forming an increased impurity concentration region between the lowest impurity concentration region and the second lowest impurity concentration region having the same conductivity type as the lowest impurity concentration region and having a doping profile such that this increased impurity concentration region is depleted under reverse biasing before critical field is reached therein. Thus, the increased impurity concentration region offers a lower series resistance while not affecting the breakdown characteristics of the high voltage PN junction. The increased impurity concentration region extends equally distant vertically and laterally from the second lowest impurity concentration region. The impurity concentration profile of the increased impurity concentration region is such that critical field is reached substantially simultaneously in the lowest impurity concentration region and the increased impurity concentration region. The increased impurity concentration region may be formed at the body-drain junction of a insulated gate field effect transistor or base collector junction of a bipolar transistor. In a four layer device, the increased impurity concentration region would be formed around the first and third layer portion of a four layer device. A method of forming the increased impurity concentration region would include forming the second lowest impurity concentration region and the increased impurity concentration region through the same mask to assure vertical and lateral self-alignment Other methods to form the equal lateral and vertical spread may also be used.

Other objects, advantages and novel features of the present invention will become apparent from the following detailed description of the invention when considered in conjunction with the accompanying drawings.

DETAILED DESCRIPTION OF THE DRAWINGS

By way of introduction, when a high voltage junction is reverse biased, the maximum electric field E occurs at the junction and depletion layers spread out into the semiconductor regions adjacent to the junction. The electric field decreases monotonically over a large area of the lightly doped side of the junction and monotonically over a very short portion of the heavier doped side of the junction It is well known that the critical field for the breakdown increases with increased doping. It is these facts that are applied in the present invention to decrease the resistivity in the lightly doped region of a three or four layer device while maintaining the breakdown capacity of this region.

Figure 1:
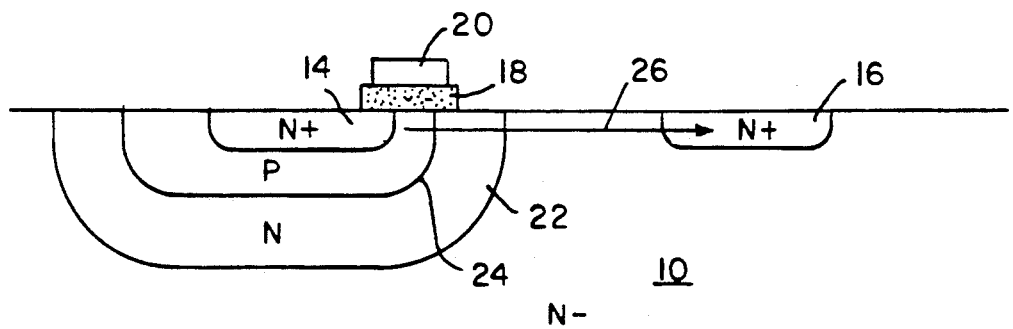
FIG. 1 is a cross-sectional view of a lateral DMOS incorporating the principles of the present invention.

A lateral insulated gate field effect transistor incorporating these principles is illustrated in FIG. 1. The drain is an N− substrate region 10 having a P body region 12 with an N+ source region 14 therein and an N+ drain contact region 16 in the drain region 10. A gate oxide 18 and gate 20 extends along the surface over the channel portion of body region 12 between the N+ source region 14 and the drain region 10. This is a standard structure for a lateral doubly diffused insulated gate field effect transistor.

The present invention incorporates an increased impurity concentration N region 22 at the drain-body junction 24. The N-type region 22 has a decreasing impurity concentration profile from the junction 24 into the drain region 10. The impurity concentration profile deceases sufficiently that the region 22 is depleted under reverse biasing before critical field is reached therein. Preferably this region is such that critical field is reached in the increased impurity region 22 and in the drain region 10 substantially simultaneously. With this preferred profile of simultaneous critical field being reached, the junction breakdown is as high as it would have been in the absence of the increased impurity concentration region 22.

The vertical and lateral spread of the increased impurity concentration region 22 assures that there is not premature critical field being reached in the added region 22 or that the series resistance would be increased in any direction. The current path is created, as indicated by arrow 26, between the source region 14 across the surface of the body region 12, high impurity concentration region 22, low impurity concentration drain region 10 to drain contact region 16. The N increased impurity concentration region 22 reduces the series resistance by providing a region of low resistance in at least part of the current flow path while the diminishing doping profile assures maintenance of a high breakdown voltage.

It should be noted that the use of increased impurity concentration regions of the same conductivity type as the lower impurity region have been used as punch-through shields. These typically in a three layer device have protected the forward bias low breakdown junction from the depletion spread from the high voltage breakdown junction. For example, in a lateral bipolar transistor, the emitter-base junction will include a punch-through shield around the emitter having the same conductivity type as the base region but having a higher impurity concentration. This protects the emitter-base junction from the depletion spread from the reverse bias collector-base junction. This is a totally different structure and operation than the present invention since the increased impurity concentration region of the present invention is at the low impurity concentration junction which is being reverse biased. Thus, not only is it in a different location, but it operates in a totally different function and manner.

Figure 2:
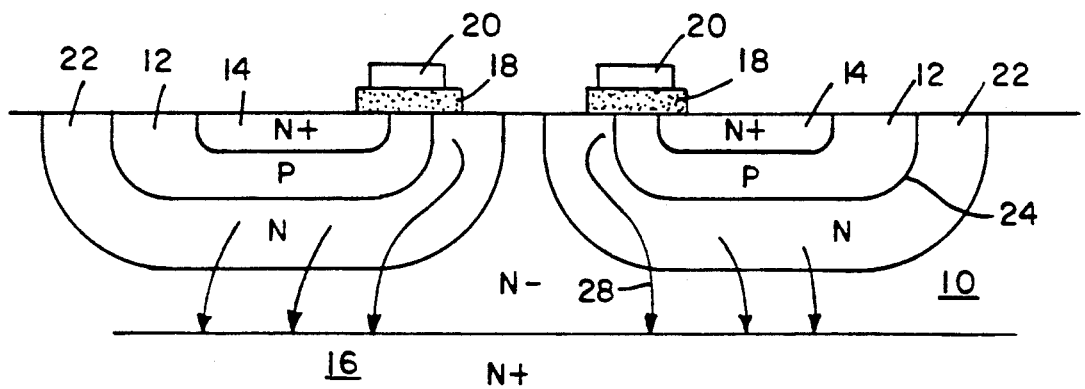
FIG. 2 is a cross-sectional view of a vertical DMOS incorporating the principles of the present invention

The principle of the present invention is also applicable to vertical doubly diffused insulated gate field effect transistors as illustrated in FIG. 2. The N− drain region 10 is shown as being formed on the N+ buried drain region 16'. This region 10 may be an epitaxial layer. The body region 12, source region 14 and increased impurity concentration 22 are shown formed as annuluses or rings. Similarly, the gate oxide 18 and gate region 20 are also shown formed as annuluses or rings. The current lines 28 are shown as substantially vertical extending from the surface source region 14 down through the body regions 12, increased impurity concentration region 22, low impurity concentration drain region 10 to buried drain contact region 16'. The impurity concentration profile and, thus, the operation of the increased impurity concentration region 22 is the same for the vertical insulated gate field effect transistor of FIG. 2 as it is for the lateral insulated gate field effect transistor of FIG. 1.

Figure 3:
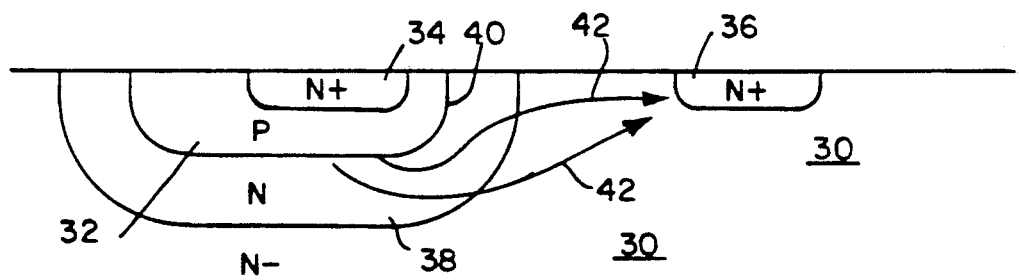
FIG. 3 is a cross-sectional view of a high voltage bipolar transistor incorporating the principles of the present invention.

A high voltage bipolar transistor is illustrated in FIG. 3 as including a low impurity N− concentration collector region 30 having a P base region 32 formed therein, an N+ emitter region 34 formed in the base region 32 and an N+ collector contact 36 formed in the surface of the N− collector region 30. An increased impurity N-type concentration region 38 is formed at the PN junction 40 between the base region 32 and collector region 30. The impurity concentration profile of the region 38 decreases from the PN junction 40 through the collector region 30. The impurity concentration is selected such that the region 38 is depleted before critical field is reached therein. As in the preferred embodiments of FIGS. 1 and 2, ideally the critical field is reached simultaneously in the increased impurity concentration region 38 and the collector region 30 simultaneously. Current lines 42 illustrate that the increased impurity region 38 reduces the collector series resistance.

Figure 4:
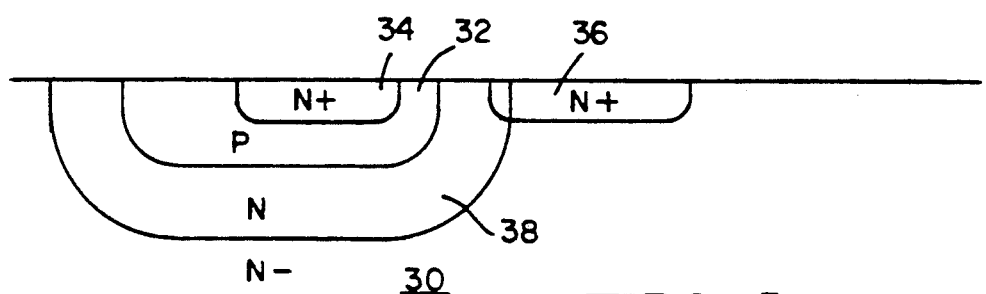
FIG. 4 is a cross-sectional view of a low voltage bipolar transistor incorporating the principles of the present invention.

The principle is also applicable to low voltage bipolar transistors as illustrated in FIG. 4. By placing the N+ contact region 36 in the increased impurity concentration region 38, the total series collector resistance is low since it does not include any of the N− collector regions 30. By placing the collector contact in the increased impurity concentration regions 38, the collector base junction cannot support as high a breakdown voltage as in FIG. 3. It should be noted that the structure of FIGS. 3 and 4 are the same except for the placement of the N+ contact region and therefore may be formed during the same process step and therefore be incorporated in a common integrated circuit.

The principles of the bipolar transistors of FIGS. 3 and 4 are also applicable to diodes. It is well known in the industry to use the base collector junction as a diode structure. Thus, the structure of FIGS. 3 and 4 could be built without emitter region 34 or the emitter 34 may be electrically inactive by not connecting it to a voltage or connecting it to the base region 32. In any application, the impurity concentration profile of region 38 is selected to deplete before critical field is reached therein. Thus, the principle is applicable to a PN junction by providing a region on the lightly doped side having a unique impurity profile.

Figure 5:
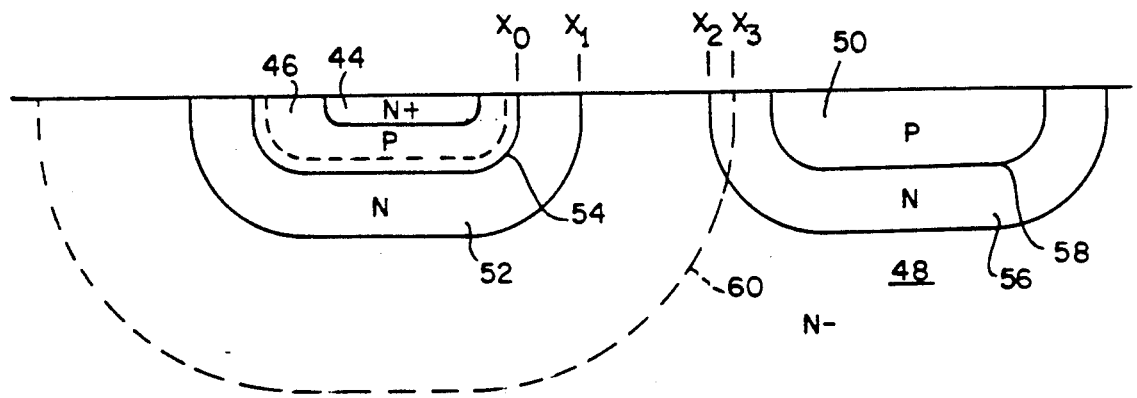
FIG. 5 is a cross-sectional view of a four layer device incorporating the principles of the present invention.

The principles are also applicable to four layer devices as illustrated in FIG. 5. An N+ cathode 44 as a first layer is formed in a second layer P-type region 46 which is formed in a third layer N− region 48. The fourth layer or anode P-type region 50 is also formed in the third layer 48. A first increased impurity concentration region 52 is formed at the PN junction 54 between the second layer 46 and the third layer 48. This region acts to reduce the series resistance while not affecting the breakdown voltage of the reverse biased junction 54 as in the previously described embodiments In addition, the four layer device of FIG. 5 includes a second increased impurity concentration region 56 at the PN junction 58 between the fourth layer 50 and the third layer 48. The second increased impurity concentration region 56 is a punch-through shield which protects the PN junction 58 from the depletion of region 54. As illustrated by the dotted line 60, the depletion of junction 54 extends towards anode 50 but is absorbed in the punch-through shield 56.

Figure 6:
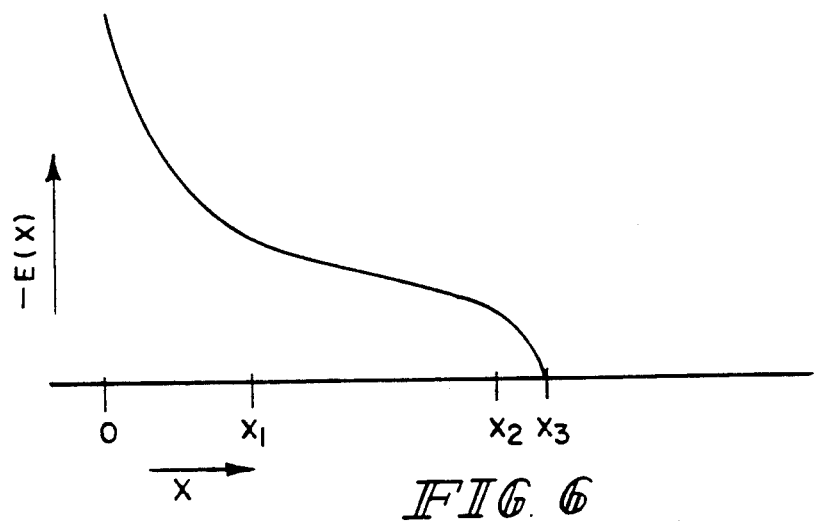
FIG. 6 is a graph of the electric field of the four layer device of FIG. 5 as a function of distance from the surface of the substrate.

FIG. 6 illustrates the electric field along the surface of the four layer device of FIG. 5. As can be seen, the major voltage drop is in the N region 52 where $X_O$ is at the PN junction 54 and continues to X1 which is the junction between the N region 52 and the N− layer 48. There is some but are not a substantial voltage drop in the N− layer 48 between X1 and X2. The final rapid fall in electric field is in the punch-through shield 56 between X2 and X3. The combination of the two increased impurity concentration regions 46 and 50 allows the heavily doped anode region 52 to be closer to the regions of significantly different voltage than would otherwise be the case. Although the four layer device is shown having the second and fourth layers 46 and 50 formed in the common surface, the anode or fourth layer 50 may be formed as a buried layer below the first layer 44 and second layer 54. The punch-through shield 56 would also be formed as a buried layer and it would serve the exact same function. Thus, the fourth layer 50 and the punch-through shield 56 could be formed as buried epitaxial layers or buried diffused regions.

Figure 7:
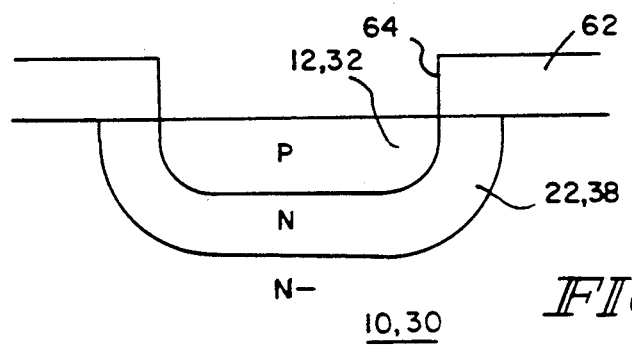
FIG. 7 is a cross-sectional view at one stage of manufacture incorporating the principles of the present invention.

A method for forming the increased impurity concentration region at the PN junction of a reverse bias junction would include, as illustrated in FIG. 7, forming a masking layer 62 on the surface of the N− substrate 10, 30. N-type impurity, for example phosphorus, are introduced through apertures 64 in the mask and diffused to form increased impurity N-type region 22, 38. Next, P-type impurities, for example boron, are introduced and diffused through the same aperture 64 in the mask 62 to form P-type region 12, 32. The region 22, 38 is formed graded because of the planar diffusion and the equal dimension of region 22, 38 extending from the P region 12, 32 is achieved by using the same mask aperture. As is well known in the processing, if oxide layers are formed in the aperture 64, a wash process may be performed to remove it between the processing of the N and P-type impurities.

Other methods may be used to form the self-aligned region using for example, two masks instead of one. The important concept being that the N region 22, 38 extends laterally and vertically equally distant from the P region 12, 32 and has a decreasing impurity concentration therefrom. The subsequent steps to form the third region of a three layer device or fourth region of a four layer device are well know and, thus, will not be described As a double diffused insulated gate field effect transistor, the N− substrate 10 would have an impurity concentration of $1 \times 10^{14}$ carriers per cubic centimeter, the N increased impurity concentration region 22 would have an average impurity concentration of $1 \times 10^{15}$ carriers per cubic centimeter, a peak impurity concentration of $2 \times 10^{15}$ carriers per cubic centimeter and a depth in the range of 2 to 20 microns. The P-type body region 12 would have a surface impurity concentration of $5 \times 10^{16}$ carriers per square centimeter and a depth of 1 to 10 microns. The emitter, base and collector of the bipolar transistor of FIGS. 3 and 4, would have the same depth and impurity concentration as corresponding regions of the DMOS devices. For the method to produce the four layer device of FIG. 5, the increased impurity concentration regions 52 and 56 are formed simultaneously in the same process step and the second layer 46 and the anode 58 are also formed simultaneously during the same process step.

It should be noted that although the present invention is described showing N-channel devices and NPN transistors, it is also applicable to P-channel devices and PNP transistors.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method of forming a three layer device, comprising:
    introducing a first conductivity type impurities into a substrate of said first conductivity type to form a first region;
    introducing a second conductivity type impurities into said first region to form a second region in and totally separated from said substrate by said first region; and
    introducing first conductivity type impurities into said second region to form a third region totally separated from said first region by said second region.

2. A method according to claim 1, wherein said introducing step to form said second region is performed to form said second region centered within said first region.

3. A method according to claim 2, including forming a mask having at least one aperture and said introducing steps to form said first and second regions are through said aperture.

4. A method according to claim 1, wherein said first, second and third regions are formed as rings.

5. A method according to claim 1, including introducing a first conductivity type impurities into said substrate to form a fourth region spaced from said second region.

6. A method according to claim 5, wherein said introducing step to form said fourth region forms said fourth region spaced from said first and second regions.

7. A method according to claim 5, wherein said introducing step to form said third and fourth regions are performed simultaneously.

8. A method according to claim 1, including forming an insulative layer over portions of said second layer at the surface of said substrate between said first and third regions and forming a gate over said insulative layer.

9. A method of forming a four layer device, comprising:
    introducing first conductivity type impurities in a substrate of said first conductivity type to form spaced first and second regions;
    introducing second conductivity type impurities into said first and second regions to form third and fourth regions separated from said substrate by said first and second regions respectively; and
    introducing first conductivity type impurities into said third region to form a fifth region separated from said first region by said third region.

10. A method according to claim 9, wherein said introducing step to form said third and fourth regions is performed to form said third and fourth regions centered with said first and second regions.

11. A method according to claim 10, including forming a mask with at least two apertures and said introducing steps to form said first and second regions and said third and fourth regions are through respective apertures.

12. A method of forming a two layer device, comprising:
    introducing a first conductivity type impurities into a substrate of said first conductivity type to form a first region having an impurity concentration profile which will deplete under reverse biasing before critical field is reached in said first region; and
    introducing a second conductivity type impurities to form a second region totally separated from said substrate by said first region.

13. A method according to claim 12, wherein said introducing step to form said second region is performed to form said second region centered within said first region.

14. A method according to claim 13, including forming a mask having a least one aperture and said introducing steps to form said first and second regions are through said aperture.

15. A method of forming a three layer device, comprising:
    introducing a first conductivity type impurities into a substrate of said first conductivity type to form a first region having an impurity concentration profile which will deplete under reverse biasing before critical field is reached in said first region;
    introducing a second conductivity type impurities to form a second region totally separated from said substrate by said first region; and
    introducing first conductivity type impurities to form a third region totally separated from said first region by said second region.

16. A method of forming a four layer device, comprising:
    introducing first conductivity type impurities in a substrate of said first conductivity type to form spaced first and second regions having concentration profile which will deplete under reverse biasing before critical field is reached in said first region;
    introducing second conductivity type impurities to form third and fourth regions separated from said substrate by said first and second regions respectively; and
    introducing first conductivity type impurities to form a fifth region separated from said first region by said third region.

* * * * *